US007789350B2

(12) United States Patent
Yu et al.

(10) Patent No.: US 7,789,350 B2

(45) Date of Patent: Sep. 7, 2010

(54) CABLE MANAGEMENT APPARATUS

(75) Inventors: Mo-Ming Yu, Shenzhen (CN); Hai-Chen Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/193,769

(22) Filed: Aug. 19, 2008

(65) Prior Publication Data

US 2009/0261213 A1 Oct. 22, 2009

(30) Foreign Application Priority Data

Apr. 16, 2008 (CN) ........................ 2008 1 0301160

(51) Int. Cl.
*F16L 5/00* (2006.01)

(52) U.S. Cl. ........................................................ 248/56

(58) Field of Classification Search ................... 248/65, 248/68.1, 70; 312/223.1, 223.2; 211/26
See application file for complete search history.

(56) References Cited

U.S. PATENT DOCUMENTS 6,305,556 B1 * 10/2001 Mayer ......................... 211/26
6,805,248 B2 * 10/2004 Champion et al. ............ 211/26
7,473,846 B2 * 1/2009 Doerr et al. .................... 174/69
2005/0145582 A1 * 7/2005 Dubon et al. ................. 211/26
2006/0081735 A1 * 4/2006 Chen et al. ................. 248/68.1
2006/0113433 A1 * 6/2006 Chen et al. ..................... 248/70
2007/0017883 A1 * 1/2007 Bridges et al. ................ 211/26
2008/0164795 A1 * 7/2008 Peng et al. ............... 312/334.5

* cited by examiner

*Primary Examiner*—J. Allen Shriver, II
*Assistant Examiner*—Erin Smith
(74) *Attorney, Agent, or Firm*—Zhigang Ma

(57) ABSTRACT

A cable management apparatus (CMA) is attached to a slide assembly. The slide assembly includes a stationary rail secured to an electronic equipment rack and a slidable rail slidably engaged with the stationary rail, the CMA includes a pair of holding arms, a connecting member, a first mounting assembly, and a second mounting assembly. The connecting member is capable of foldably connecting the two holding arms. The first mounting assembly includes a first mounting bracket and a first locking member attached to the first mounting bracket. The second mounting assembly includes a second mounting bracket and a second locking member attached to the second mounting bracket. The first mounting bracket is pivotally engaged with one of the holding arms and capable of being retained to the slidable rail by the first locking member. The second mounting bracket is pivotally engaged with the other holding arm and capable of being retained to the stationary rail by the second locking member.

15 Claims, 9 Drawing Sheets

200 II 14 12 10 24 22 20 30 100

CABLE MANAGEMENT APPARATUS

BACKGROUND

1. Field of the Invention

The present invention relates to electronic equipment racks, and particularly to a cable management apparatus installed in electronic equipment racks.

2. Description of Related Art

Electronic components, such as server units are usually slidably received in an electronic equipment rack. A slide assembly is attached on one side of a rack for mounting electronic components. Cable management apparatuses are installed in the electronic equipment rack for holding and managing the cables associated with the electronic equipments.

A typical cable management apparatus (CMA) includes two or more hinged holding arms. Two free ends of the arms are often attached to the rack and the corresponding electronic component with fasteners. A tool is required for installing or detaching the CMA. Therefore, the process is tedious and time consuming. Another problem is that an extra space is required for maneuvering with the tool. This is particularly problematic for smaller components (such as 1 U server units).

DETAILED DESCRIPTION

Figure 1:
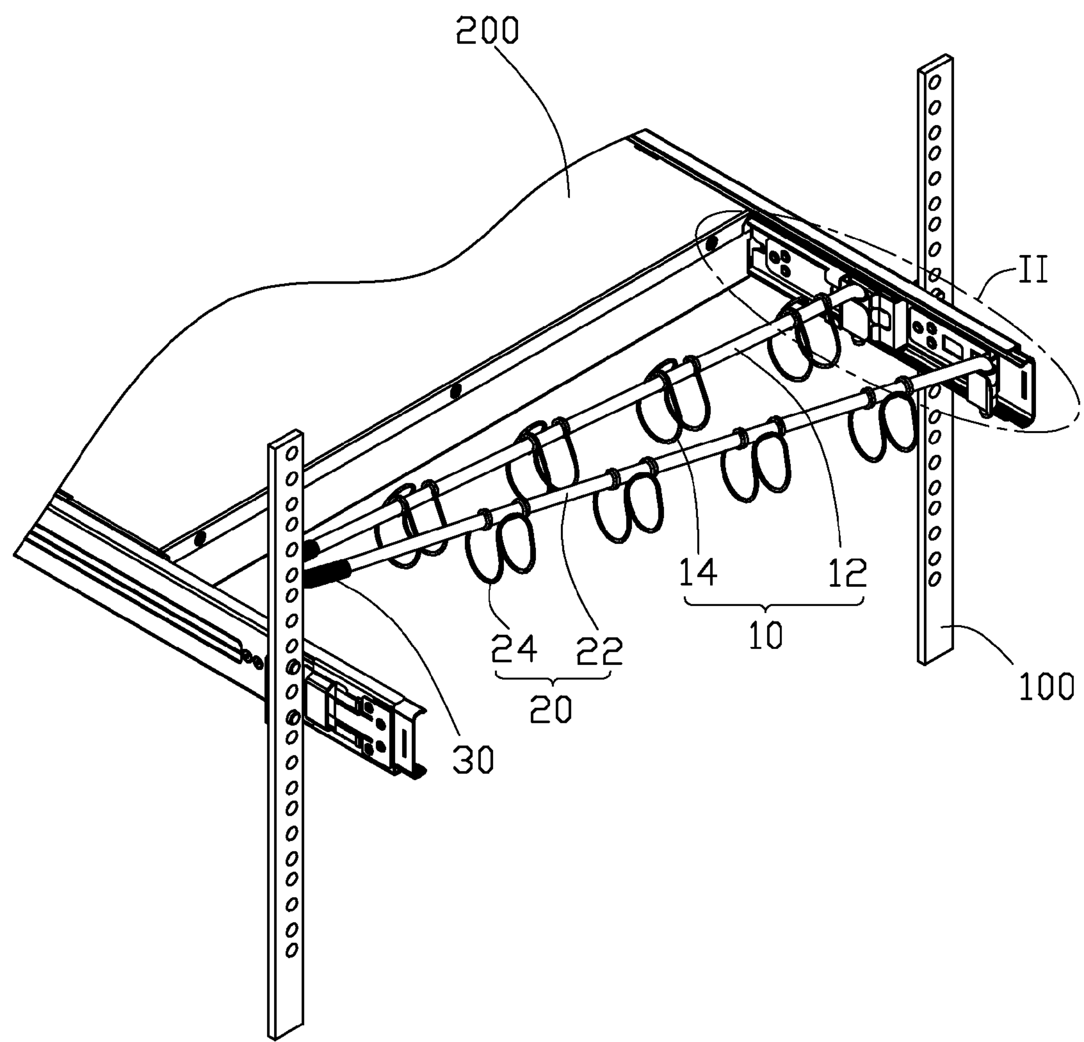
FIG. 1 is an assembled, isometric view of a cable management apparatus (CMA) in accordance with an embodiment of the present invention.
Figure 2:
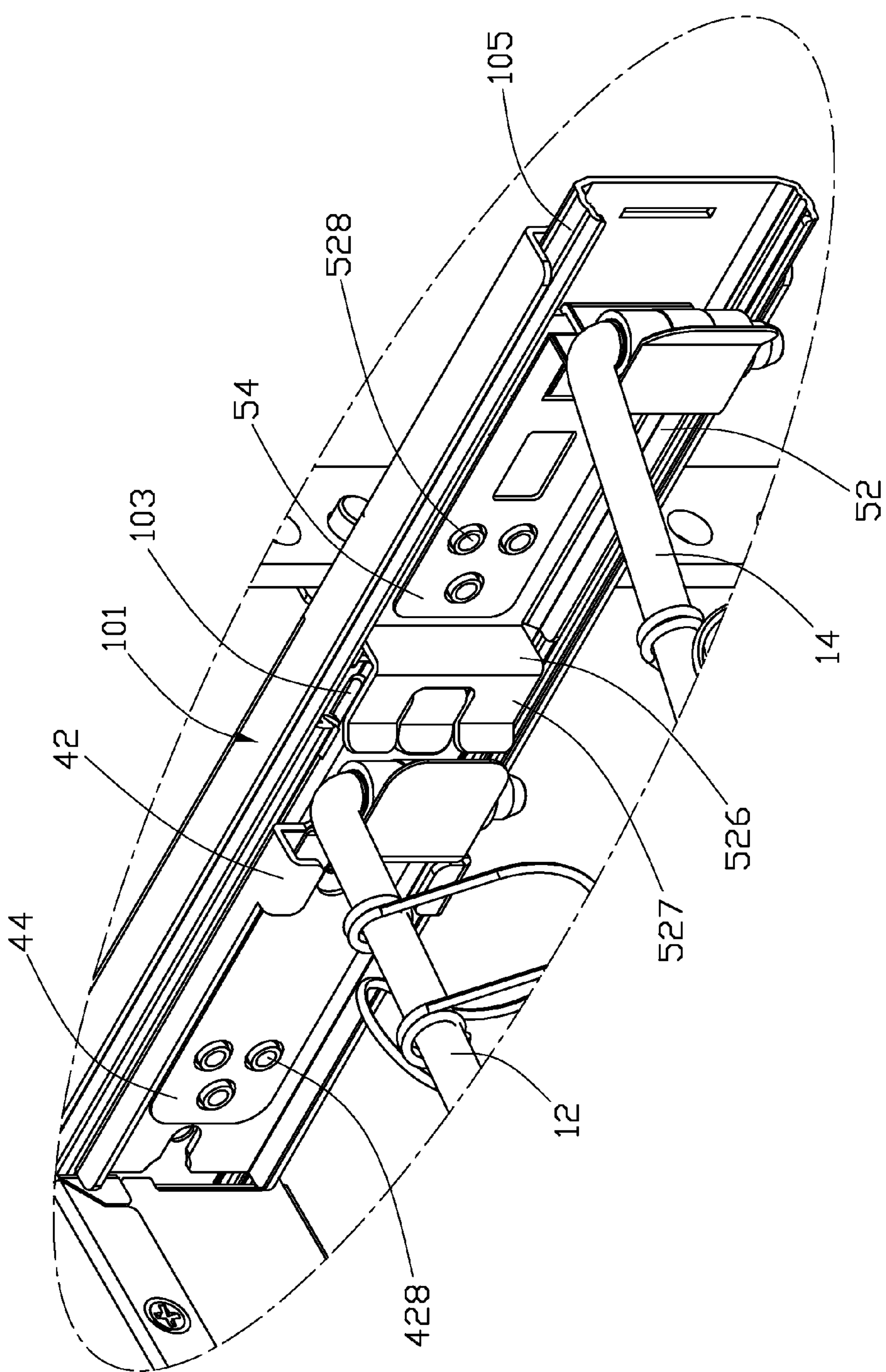
FIG. 2 is an enlarged view of the encircled portion II of FIG. 1.

Referring to FIGS. 1, 2, 6 and 8, a CMA in accordance with an exemplary embodiment is installed in an electronic equipment rack 100 to hold and manage cables associated with an electronic component 200.

The rack 100 includes a slide assembly 101 mounted to a side thereof. The slide assembly 101 includes a stationary rail 105 and a slidable rail 103 slidably engaged with the stationary rail 105. In the present embodiment, the slidable rail 103 may be an inner rail and the stationary rail 105 may be an outer rail. The slidable rail 103 includes two anchor members 104*a*, 104*b* extending therefrom. The anchor members 104*a*, 104*b* are generally mushroom-like. The anchor member 104*a* includes a head portion 1044*a* and a neck portion 1042*a*. The anchor member 104*b* includes a head portion 1044*b* and a neck portion 1042*b*. The stationary rail 105 defines a generally "C"-like cross section and a pair of receiving portions 106 in a rear end thereof.

Figure 3:
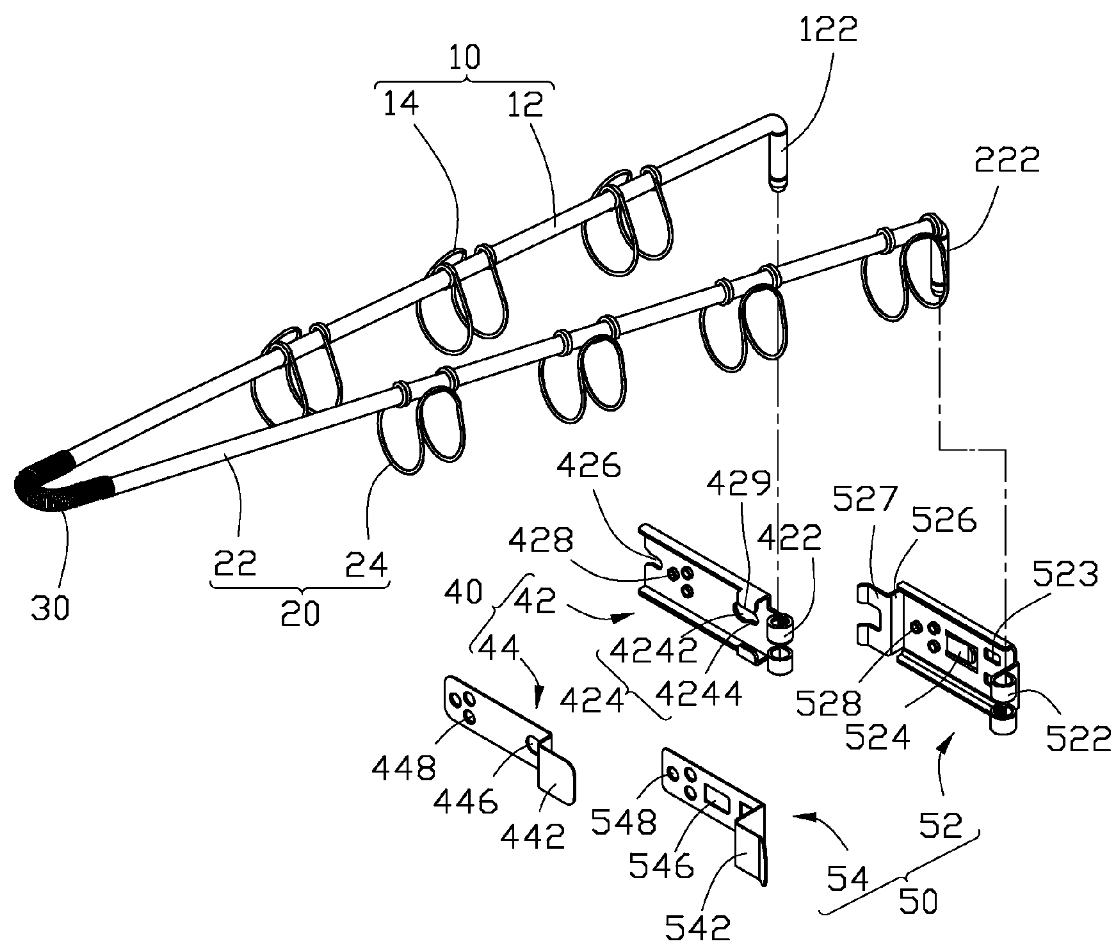
FIG. 3 is an exploded, isometric view of the CMA of FIG. 1.
Figure 4:
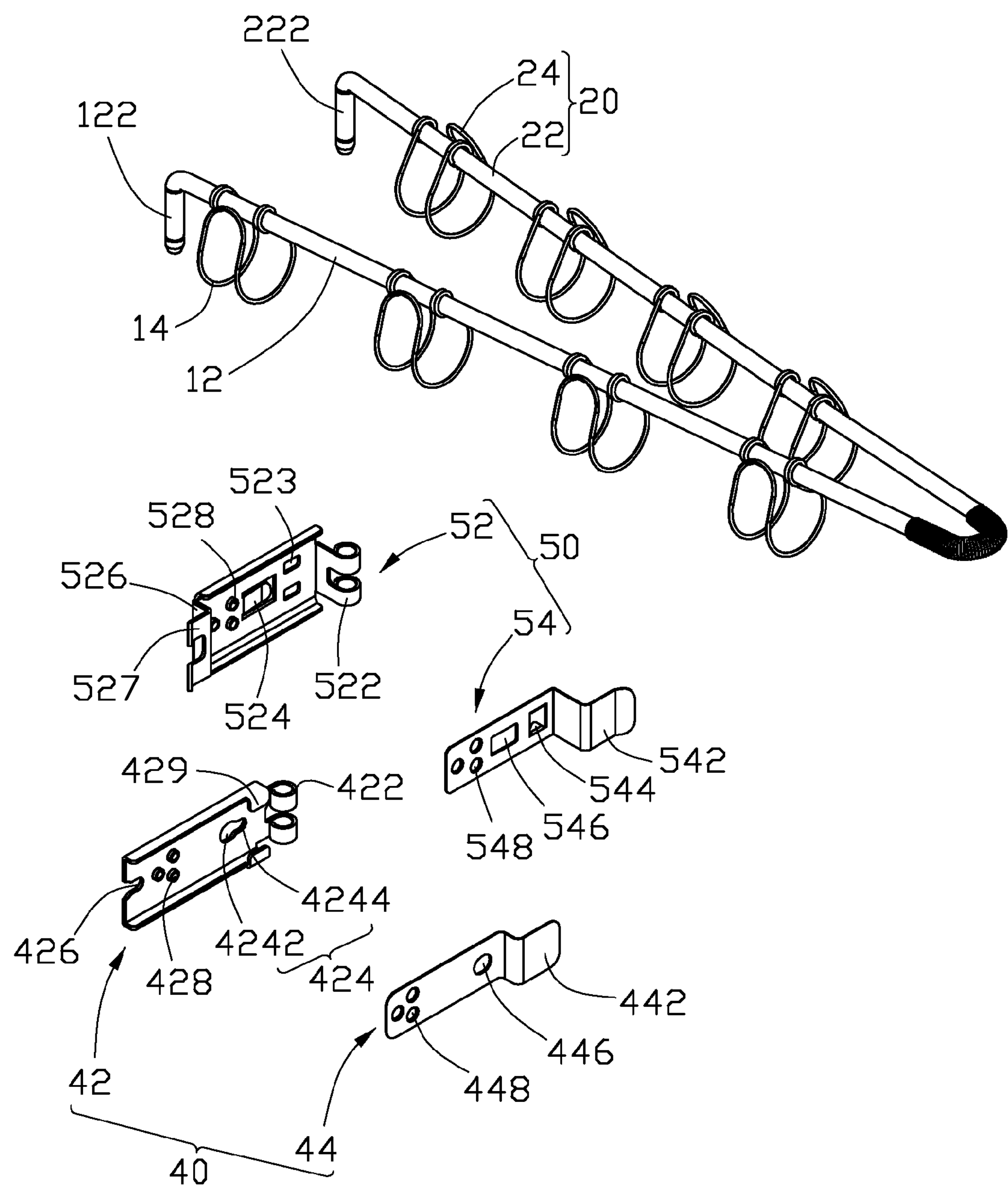
FIG. 4 is a similar to FIG. 3, but viewed from another aspect.

Referring also to FIGS. 3 and 4, the CMA includes a first holding arm 10, a second holding arm 20, a connecting member 30, a first mounting assembly 40 and a second mounting assembly 50.

The first holding arm 10 includes a pole-like main body 12 and a plurality of clips 14 attached to the main body 12. A pivoting portion 122 vertically extends from a first end of the main body 12.

The second holding arm 20 includes a pole-like main body 22 and a plurality of clips 24 attached to the main body 22. A pivoting portion 222 vertically extends from a first end of the main body 22.

In the present embodiment, the connecting member 30 may be a coil spring. Second ends of the first holding arm main body 12 and the second holding arm main body 22 are respectively connected to opposite ends of the connecting member 30. The present disclosure contemplates alternative connecting means allowing the first holding arm 10 and the second holding arm 20 to be folded related to each other.

The first mounting assembly 40 includes a mounting bracket 42 and a resilient locking member 44. A connecting interface 422 is formed at a first end of the mounting bracket 42 and capable of being pivotally engaged with the pivoting portion 122 of the first holding arm main body 12. In the present embodiment, the connecting interface 422 includes two hollowed cylinders offset from each other. A mounting hole 424 is defined in the mounting bracket 42 adjacent to the connecting interface 422. The mounting hole 424 includes a guiding portion 4242 and a positioning portion 4244 communicated with each other. A notch 426 is defined in a second end of the mounting bracket 42 away from the connecting interface 422. A plurality of protruding portions 428 is formed on a side of the mounting bracket 42 adjacent to the notch 426. A pair of limiting portions 429 respectively extends towards each other from opposite edges of the mounting bracket 42. The locking member 44 is generally flat. The locking member 44 defines a plurality of coupling holes 448 near a first end thereof. A second end of the locking member 44 is bent and forms an L-shaped operating portion 442 thereof away from the coupling holes 448. A retaining hole 446 is defined in the locking member 44 adjacent to the operating portion 442.

The second mounting assembly 50 includes a mounting bracket 52 and a resilient locking member 54. A connecting interface 522 is formed at a first end of the mounting bracket 52 and capable of being pivotally engaged with the pivoting portion 222 of the second holding arm main body 22. In the present embodiment, the connecting interface 522 includes two hollowed cylinders offset from each other. A pair of through holes 523 is defined in the mounting bracket 52 adjacent to the connecting interface 522. A resisting portion 524 is formed at a middle of the mounting bracket 52. A first bent portion 526 vertically extends from a second end of the mounting bracket 52 opposite to the first end thereof, and a second bent portion 527 perpendicularly extends from the a first bent portion distal end. A plurality of protruding portions 528 is formed on a side of the mounting bracket 52 adjacent to the first bent portion 526. The locking member 54 is generally flat. The locking member 54 defines a plurality of coupling holes 548 near a first end. A second end of the locking member 54 is bent and forms an L-shaped operating portion 542 thereof far from the coupling holes 548. A pair of locking tabs 544 extends from a side of the locking member 54 adjacent to the operating portion 542. An aperture 546 is defined in a middle of the locking member 54 capable of being aligned with the resisting portion 524 of the mounting bracket 52.

Figure 5:
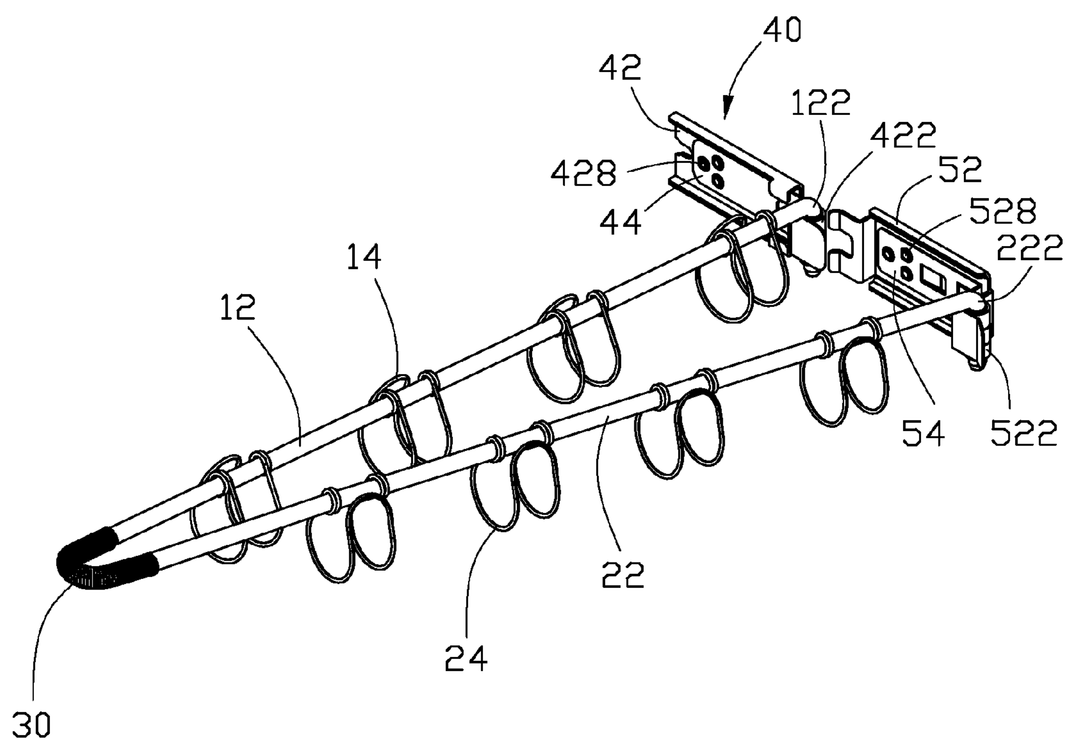
FIG. 5 is an assembled view of FIG. 3.

Referring also to FIG. 5, in assembly of the CMA, the first mounting assembly 40 is assembled by securing the protruding portions 428 of the mounting bracket 42 in the coupling holes 448 of the locking member 44. The positioning portion 4244 of the mounting hole 424 is aligned with the retaining hole 446 of the locking member 44, and the guiding portion 4242 is shielded by the locking member 42. The second mounting assembly 50 is assembled by securing the protruding portions 528 of the mounting bracket 52 in the coupling holes 548 of the locking member 54. The locking tabs 544 of the locking member 54 extend through the through holes 523 of the mounting bracket 52. The aperture 546 of locking member 54 is aligned with the resisting portion 524 of the mounting bracket 52. The first holding arm pivoting portion 122 and the second holding arm pivoting portion 222 are respectively pivotally received in the connecting interface 422 and the connecting interface 522.

Figure 6:
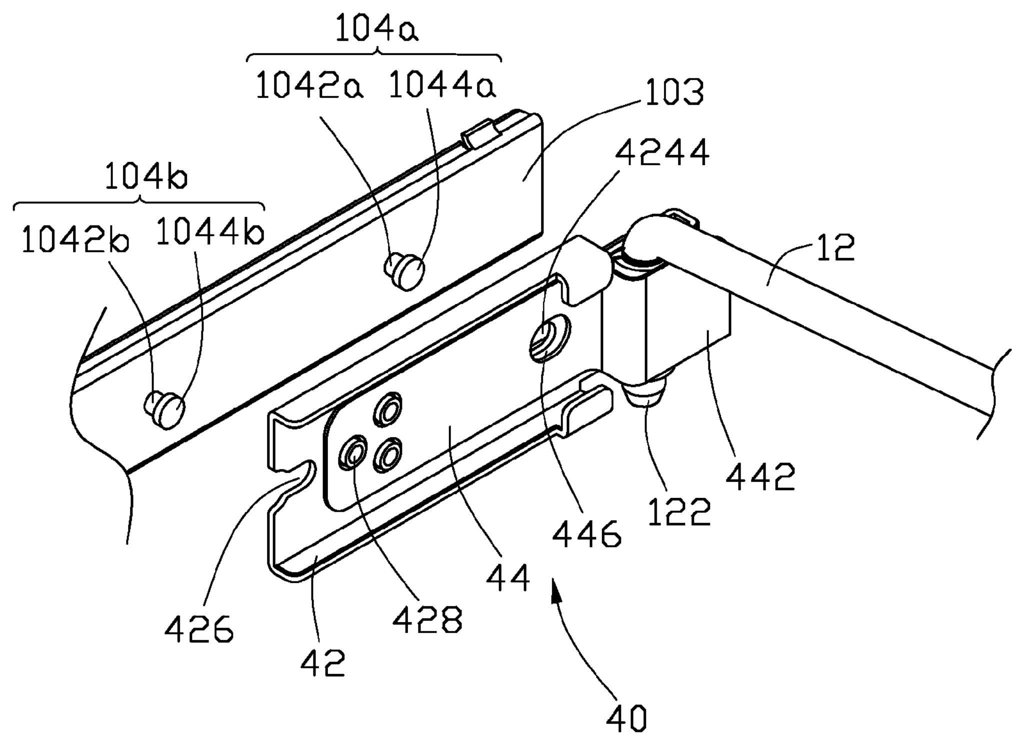
FIG. 6 is an enlarged, partially assembled view of the CMA and a slidable rail of FIG. 1.
Figure 7:
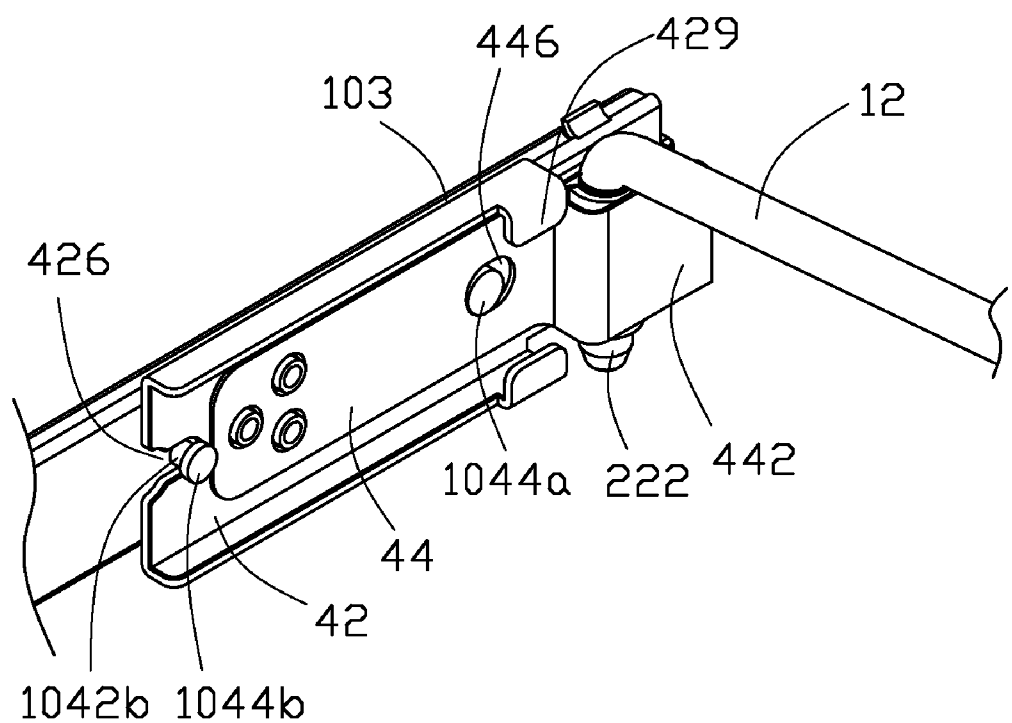
FIG. 7 is an assembly view of FIG. 6.

Referring also to FIGS. 6 and 7, to attach the first mounting assembly 40 to the slidable rail 103 of the slide assembly 101, the anchor member 104*a* is inserted into the guiding portion 4242 of the first mounting bracket mounting hole 424. The head portion 1044*a* of the anchor member 104*a* resists against the locking member 44, therefore the locking member 44 is urged to deformed and move away from the mounting bracket 42. The mounting bracket 42 slides along the slidable rail 103 to a predetermined locking position and the neck portion 1042*a* of anchor member 104*a* is engaged into the positioning portion 4244 of the mounting hole 424. At the same time, the neck portion 1042*b* of anchor member 104*b* is engaged into the notch 426 of the mounting bracket 42. When the head portion 1044*a* of the anchor member 104*a* is aligned with the retaining hole 446 of locking member 44, the locking member 44 is restored and the head portion 1044*a* is engaged into the retaining hole 446. Therefore, the anchor member 104*a* is securely retained in the positioning portion 4244 of the mounting hole 446 and the first mounting assembly 40 is secured to the slidable rail 103.

Figure 8:
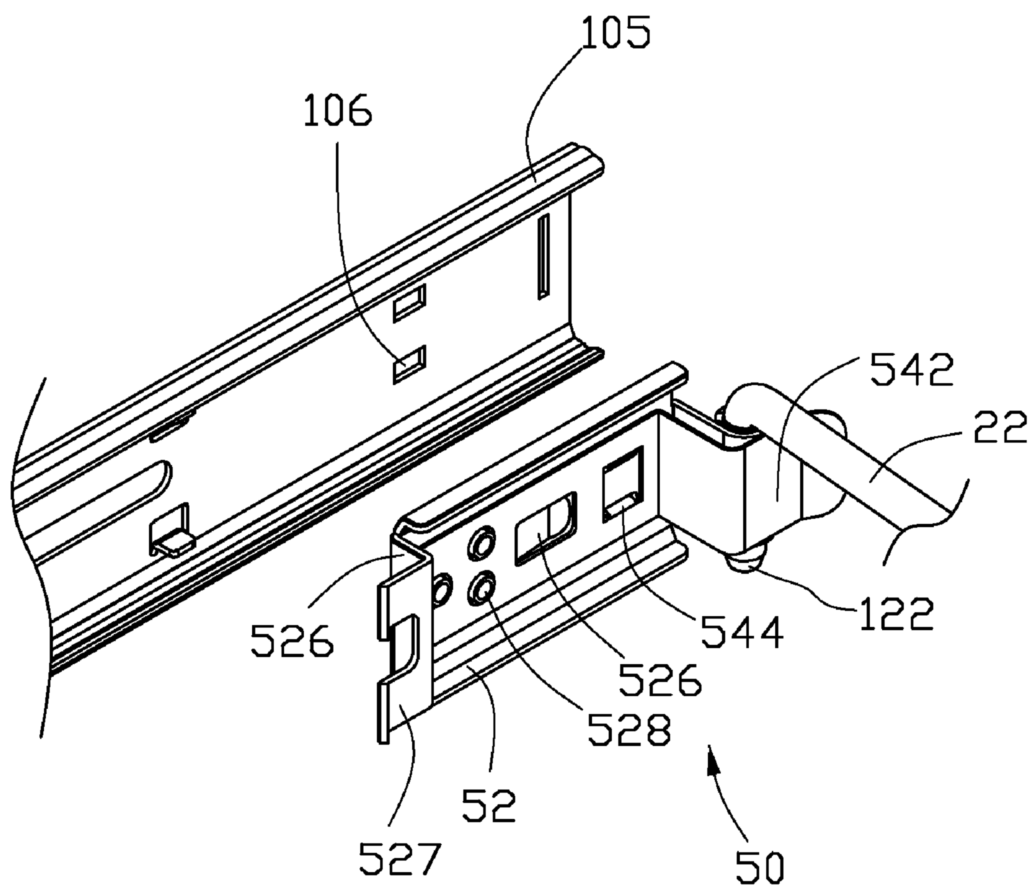
FIG. 8 is an enlarged, partially assembled view of the CMA and a stationary rail of FIG. 1.
Figure 9:
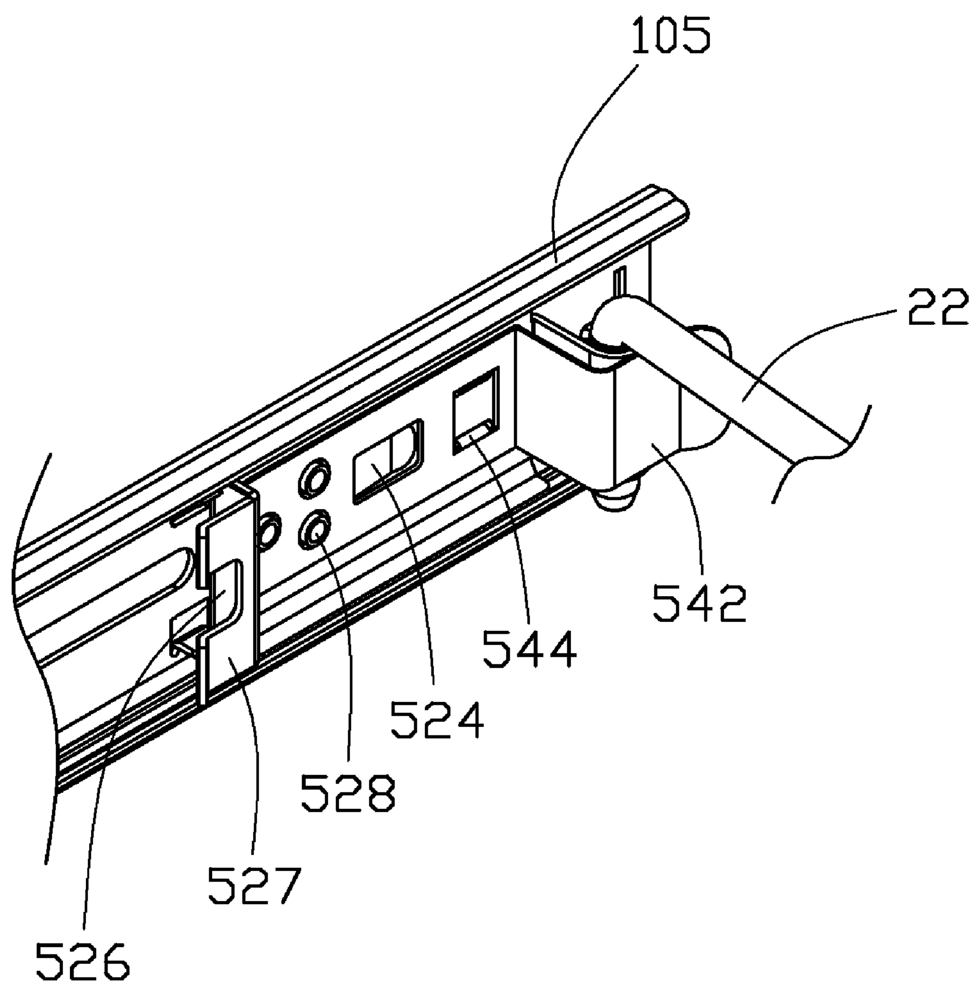
FIG. 9 is an assembly view of FIG. 8.

Referring also to FIGS. 8 and 9, to attach the second mounting assembly 50 to the stationary rail 105 of the slide assembly 101, the mounting bracket 52 slides into the stationary rail 105 from the rear end thereof. The locking tabs 544 of the locking member 54 resist against the stationary rail 105, therefore, the locking member 54 is deformed and urged to move away from the mounting bracket 52. When the mounting bracket 52 slides on to a predetermined locking position, the locking tabs 544 is aligned with the receiving portions 106; the locking member 54 restores and the locking tabs 544 is engaged into the receiving portions 106. Therefore, the second mounting assembly 50 is prevented from sliding along the stationary rail 105. The second mounting assembly 50 is also prevented from moving vertically related to the stationary rail 105 because of the "C"-like the stationary rail 105 enclosing the mounting bracket 52.

In use of the CMA, cables of electronic component 200 are attached to the first holding arm 10 and the second holding arm 20 by the clips 14 and 24. When the electronic component 200 is pushed into the electronic equipment rack 100, the CMA is folded behind the electronic component 200. The rear end of the slidable rail 103 is engaged between the second bent portion 527 and the stationary rail 105; the second bent portion 527 abuts against the slidable rail 103. Therefore, the slide assembly 101 is prevented from being damaged by the torque generated by the weight of the CMA. When the electronic component 200 is brought to an extended position, the second mounting assembly 40 is moved forward with the slidable rail 103 and the CMA is extended.

To detach the CMA from the slide assembly 101, the operating portion 442 is manipulated to move far away from the mounting bracket 42, so that the retaining hole 446 of the locking member 44 is disengaged with the anchor member 104*a*. Therefore, the mounting bracket 42 can be pulled to slide back, accordingly, the neck portion 1042*a* of the anchor member 104*a* moves from the mounting hole positioning portion 4244 to the guiding portion 4242. At the same time, the anchor member 104*b* is disengaged with the notch 426 of the mounting bracket 42. Then, the mounting bracket 42 can be detached from the slidable rail 103. In the detaching process described above, the limiting portions 429 of the mounting bracket 42 are located and configured to prevent the locking member 44 from being destroyably deformed.

The operating portion 542 is manipulated to move far away from the mounting bracket 52, so that the locking tabs 544 of the locking member 54 are disengaged with the receiving portions 106 of the stationary rail 105. Then, the mounting bracket 52 can be pulled to slide backwards and detached from the stationary rail 105.

The foregoing description of the exemplary embodiment of the invention has been presented only for the purposes of illustration and description and is not intended to be exhaustive or to limit the invention to the precise forms disclosed. Many modifications and variations are possible in light of the above teaching. The embodiment was chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A cable management apparatus for being mounted to a sliding rail assembly, the slide assembly comprising a stationary rail and a slidable rail slidably engaged with the stationary rail, the cable management apparatus comprising:

two holding arms, each holding arm has a first end and a second end;

a connecting member connecting the holding arms at the second ends thereof, and allowing the holding arms to be folded related to each other;

a first mounting assembly comprising:

a first mounting bracket pivotally engaged with one of the holding arms and defining a mounting hole receiving an anchor member extending from the slidable rail in response to the first mounting bracket sliding along the slidable rail to a locking position thereof, and a first locking member attached to the first mounting bracket, and releasably engaging with the anchor member, thereby preventing the anchor member from exiting from the mounting hole of the first mounting bracket; and a second mounting assembly comprising a second mounting bracket pivotally engaged with the other holding arm, and a second locking member attached to the second mounting bracket, the second mounting bracket capable of being slid along the stationary rail to a locking position thereof wherein the second locking member is fixedly engaged with the stationary rail to detachably retain the second locking assembly to the stationary rail.

2. The cable management apparatus as described in claim 1, wherein each holding arm comprises a pole-like main body and a plurality of clips attached thereto.

3. The cable management apparatus as described in claim 2, wherein main bodies of the two holding arms respectively comprises a pivoting portion vertically extending from a first end thereof; each of the first mounting bracket and the second mounting bracket comprises a connecting interface corresponding to be pivotally engaged with the pivoting portions of the main bodies of the two holding arms.

4. The cable management apparatus as described in claim 3, wherein the connecting member is a coil spring, the second ends of the holding arms are connected to opposite ends of the connecting member.

5. The cable management apparatus as described in claim 1, wherein first ends of the first locking member and the second locking member are correspondingly secured to the first mounting bracket and the second mounting bracket, second ends of the first locking member and the second locking member are cantilevered.

6. The cable management apparatus as described in claim 5, wherein each of the first mounting bracket and the second mounting bracket comprises a plurality of protruding portions extending therefrom; each of the first locking member and second locking member defines a plurality of coupling holes in the first end thereof to correspondingly securely engage with the first mounting bracket protruding portions and the second mounting bracket protruding portions.

7. The cable management apparatus as described in claim 6, wherein the second locking member comprises at least one locking tab formed near the second end thereof adapted to be engaged into a receiving portion defined in the stationary rail.

8. The cable management apparatus as described in claim 6, wherein each of the first locking member and the second locking member comprises an operating portion formed at the second end thereof.

9. The cable management apparatus as described in claim 6, wherein the second mounting bracket further comprises a first bent portion vertically extending from an end thereof, and a second bent portion vertically extending from the first bent portion; an end of the slidable rail is adapted to be received between the second bent portion and the stationary rail, and abuts against the second bent.

10. The cable management apparatus as described in claim 5, wherein the mounting hole of the first mounting bracket comprises a guiding portion and a positioning portion smaller than and communicating with the guiding portion; the first locking member defines a retaining hole aligned with the positioning portion of the mounting hole; when the second end of the first locking member is urged to move away from the first mounting bracket, the anchor member is engaged into the mounting hole via the guiding portion and moved to the positioning portion with the sliding movement of the first mounting bracket; when the first locking member restores, the first locking member shields the guiding portion of the mounting hole of the first mounting bracket, and the anchor member is engaged into the retaining hole of the first locking member.

11. A mounting assembly utilized to mount a holding arm to an electronic equipment rack or an electronic component slidably received in the electronic equipment rack, the mounting assembly comprising:

a mounting bracket pivotally engaged with the holding arm, and defining a mounting hole receiving an anchor member extending from the electronic equipment rack or the electronic component in response to the mounting bracket sliding along the electronic equipment rack or the electronic component; and a locking member attached to mounting bracket and releasably engaging with the anchor member to prevent the anchor member from exiting from the mounting hole of the mounting bracket in response to the mounting bracket sliding to a locking position, wherein a first end of the locking member is secured to the mounting bracket, and the locking member disengages from the anchor member in response to a second end of the locking member moving away form the mounting bracket.

12. The mounting assembly as described in claim 11, wherein the mounting hole of the mounting bracket comprises a guiding portion and a positioning portion, the anchor member is engaged into the mounting hole via the guiding portion and slides into the positioning portion in response to the mounting bracket sliding to the locking position.

13. The mounting assembly as described in claim 12, wherein the locking member defines a retaining hole, when the locking member restores, the locking member shields the guiding portion of the mounting hole of the mounting bracket, and the retaining hole is aligned with the positioning portion of the mounting hole of the mounting bracket, thereby receiving the anchor member to keep the mounting bracket at the locking position.

14. The mounting assembly as described in claim 11, wherein the second end of the locking member is cantilevered, the locking member further comprises an operating portion formed at the second end.

15. The mounting assembly as described in claim 14, wherein the mounting bracket comprises a limiting portion adjacent to the operating portion and extending to a side of the locking member opposite to the mounting bracket.

* * * * *